INVENTOR.
NOEL E. BROWN
BY Alden D. Redfield
Irwin P. Garfinkle
ATTORNEYS

INVENTOR.
NOEL E. BROWN
BY Alden D. Redfield
Irwin P. Garfinkle
ATTORNEYS

INVENTOR.
NOEL E. BROWN
BY Alden D. Redfield
Irwin P. Garfinkle
ATTORNEYS

United States Patent Office 3,191,124
Patented June 22, 1965

3,191,124

AMPLITUDE NOISE CONTROL GATE

Noel E. Brown, Cincinnati, Ohio, assignor to Avco Corporation, Cincinnati, Ohio, a corporation of Delaware Filed Oct. 30, 1961, Ser. No. 148,393
12 Claims. (Cl. 325—478)

This invention relates in general to electronic circuitry for detecting and eliminating noise from signal, and more particularly to a system for blanking the intermediate frequency amplifier of a radio receiver during periods when excessive noise is present.

Impulse noise of the type caused by lightning, ignition systems, etc., often produces short-term high energy components in a broad frequency spectrum. In radio receivers where amplification and detection is employed, this type of interference can jam desired transmissions and incapacitate the system. Impulse noise entering the receiver may cause the tuning circuits, and particularly the narrow band I-F filter, to ring at frequencies within the pass band. Thus the noise will be amplified through the receiver both in magnitude and time to such an extent that the intelligence of the signal is quite seriously impaired. This condition is exaggerated in single sideband equipment, and the present invention was motivated for use in such equipment.

It is therefore an object of this invention to provide a system for detecting and eliminating impulse noise from signal in a radio frequency receiver.

Another object of this invention is to provide above threshold noise rejection in a radio receiver by delaying signal transmission through the receiver during the period when noise pulses are detected and processed to provide blanking of the intermediate frequency amplifier of the receiver at the time that the noise pulse appears in the intermediate frequency amplifier.

Still another object of this invention is to provide an automatic noise rejection system for a radio receiver which permits normal receiver operation when no impulse noise is present.

Another object of this invention is the suppression of impulse noise in a radio frequency receiver with no significant loss of intelligence.

Another object of this invention is to provide unique electronic circuitry for processing noise impulses to provide a blanking pulse for the intermediate frequency amplifier of a radio receiver.

Another object of this invention is to provide a noise suppression system for a radio receiver in which signal is delayed before application to the intermediate frequency amplifier, and in which impulse noise is processed in a fast acting electronic circuit to produce a blanking pulse for the intermediate frequency amplifier during the appropriate intervals when noise would be passed.

Still another object of this invention is to provide a noise impulse amplifier stage including a varactor diode bridge, pre-biased for a given threshold level of operation, and controlled in accordance with signal level from a source of automatic gain control.

For further objects and for a more complete understanding of the precise nature of this invention reference is made to the following detailed specification and to the accompanying drawings in which.

Briefly described, this invention provides a radio receiver in which impulse noise is suppressed by means of an electronic link inserted between the radio frequency tuner and the intermediate frequency amplifier. The electronic link functions to delay the signal while detecting and conditioning the spurious impulse interference to produce a blanking pulse which is applied to the intermediate frequency amplifier during the period when the impulse noise approaches that stage for amplification. In the embodiment illustrated, received radio frequency energy (of a single sideband nature) modulated with both signal and noise impulses is applied to a radio frequency tuner-converter which produces and amplifies a complex output signal including both desired signal and impulse noise. The complex output signal is applied through two channels, the first or signal channel serving to pass the output signal to an intermediate frequency amplifier through a delay circuit. The second or noise channel includes a control or noise gate loop which provides blanking of the intermediate frequency amplifier when impulse noise exceeds a predetermined level. Since the signal is delayed, time is provided to process the noise through the noise channel, and to assure blanking in the intermediate frequency amplifier during noise periods. The blanking pulse has a duration which exceeds the duration of expected noise. In addition, the invention includes unique circuitry for performing these functions.

Figure 1:
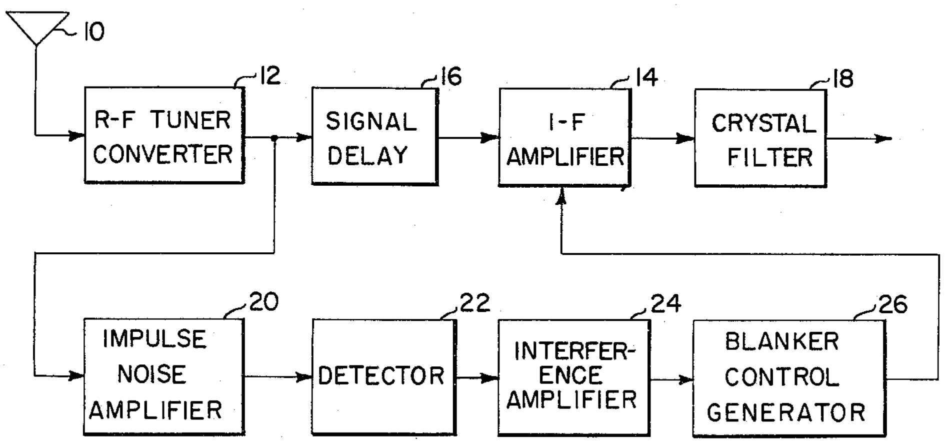
FIG. 1 is a block diagram of a radio receiver incorporating the principles of this invention.

Referring to the block diagram of FIG. 1, there is shown a single sideband radio receiver having an antenna 10 connected to a conventional radio frequency tuner-converter 12. While the invention was reduced to practice in connection with single sideband equipment, and circuitry adapted to that application is described, it will be understood that the invention works equally well with double sideband receivers, or any other type of radio energy receiving systems. The output from the radio frequency converter 12 is a complex signal including both noise and desired signal, and this output is processed through two channels, a signal channel and a noise channel. In the signal channel the output of the radio frequency tuner-converter 12 is applied to an intermediate frequency amplifier 14 through a signal delay element or circuit 16. The output from the intermediate frequency amplifier 14 is then applied to a conventional crystal filter 18.

The noise channel processes the output of the tuner-converter to provide a blanking pulse for intermediate frequency amplifier 14. The ouput from the radio frequency turner-converter 12 is amplified in an impulse noise amplifier 20 in the noise channel and the output from the amplifier 20 is then detected and filtered in a detector 22 to eliminate all signal and to provide noise impulses to the interference amplifier 24. The output from the interference amplifier 24 is then applied to a blanker control generator 26 which includes circuitry for generating the blanking pulse for cutting off the intermediate frequency amplifier 14. The blanking pulse begins before the delayed signal reaches the intermediate frequency amplifier 14, and it has a duration sufficient to cut off that amplifier for the duration of the expected noise.

Figure 2:
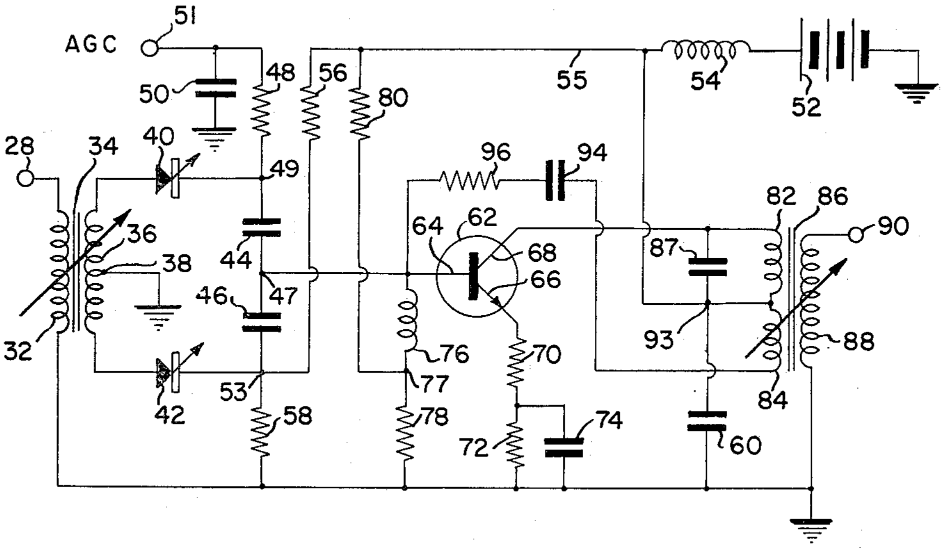
FIG. 2 is a circuit diagram of a preferred form of impulse noise amplifier employed in the system of FIG. 1.

The details of the impulse noise amplifier 20 are shown in FIG. 2. The output from the radio frequency tuner-converter 12 is applied at terminal 28 across the primary winding 32 of input transformer 34. The secondary winding 36, having a center tap 38, constitutes the voltage source of a varactor diode bridge which includes the varactors 40 and 42 and the capacitors 44 and 46, all connected in a series loop. It will be seen that the output of the bridge is derived from between the center tap 38 and the junction 47 of capacitors 44 and 46.

For a purpose hereinafter to be described, a variable source of automatic gain control voltage derived from the audio stages (not shown) of the receiver is applied at terminal 51 to the junction 49 of varactor 40 and capacitor 44 through a reisitor 48. A capacitor 50 provides an intermediate frequency by-pass. In addition, a fixed bias is applied to the junction 53 of capacitor 46 and varactor 42 by means of a connection from the battery 52 through a choke 54, lead 55, and biasing resistors 56 and 58. The capacitor 60 provides an alternating current by-pass to ground.

A transistor 62, having a base 64, an emitter 66, and a collector 68, is provided for amplifying the output from the varactor bridge. The base 64 of transistor 62 is connected to the junction 47 while the emitter 66 is connected to ground through emitter-resistors 70 and 72, the resistor 72 being by-passed for alternating currents by the capacitor 74. It will thus be observed that the base-emitter input circuit of transistor 62 is connected across the output terminals of the varactor bridge, namely between the grounded center tap 38 and the junction 47.

Direct current biasing for the base 64 is provided by means of a connection from the base 64 through a coil 76 to the junction 77 of resistors 78 and 80. Collector output is applied across the primary windings 82 and 84 of a transformer 86, a capacitor 87 being connected across the winding 82, and the capacitor 60 providing a connection to ground. A feedback connection for the purpose of neutralization is provided from the junction 93 of the primary windings 82 and 84 to the base 64 through a capacitor 94 and a resistor 96. The output from secondary winding 88 of transformer 86 is derived at the terminal 90. Biasing for the collector 68 of transistor 62 is provided by means of a connection from the line 55 to the junction 93. It will be understood that additional stages of amplification may be required and similar amplifications, such as shown in FIG. 2, may be cascaded. The last stage of amplification will then be applied to the detector 22.

In operation, the varactor 42 is pre-biased by means of the connection to the resistors 56 and 58 so as to unbalance the varactor bridge. Thus upon the application of a complex signal including desired signal and noise to the transformer 34, an output is developed between center tap 38 and junction 47, and across the base-emitter input circuit of transistor 62. It will be observed that the degree of unbalance, and hence the magnitude of the input to the transistor 62, may be varied by changing the bias on the varactor 42 by applying a varying direct current voltage. This has been done by means of the connection to the AGC source through resistor 48. Thus, the AGC voltages applied to varactor diode 40 tend to rebalance the bridge and reduce the signal by amounts proportional to signal strength. By means of this arrangement the threshold level of the entire noise channel is made variable in accordance with desired signal strength, and this is an important feature of this invention.

Figure 3:
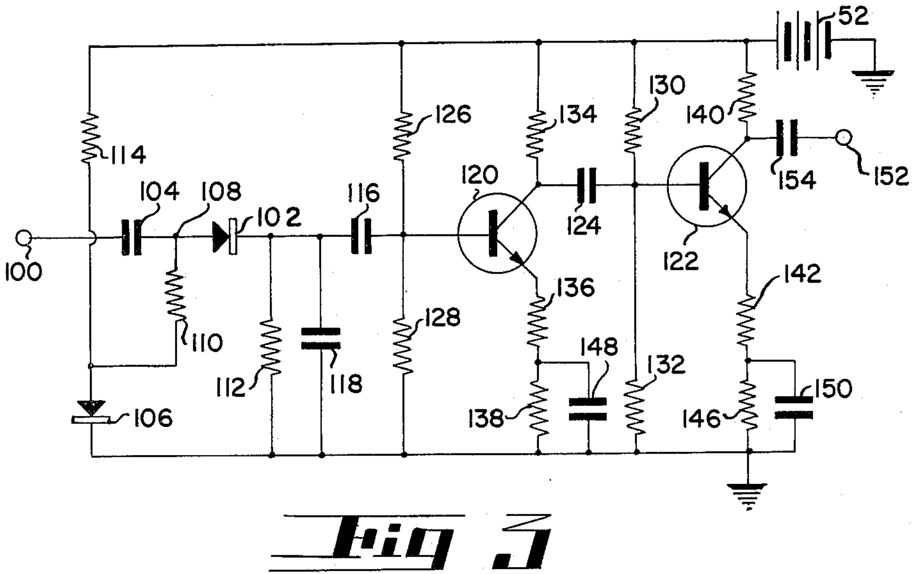
FIG. 3 is a schematic circuit diagram of a preferred form of detector and interference amplifier incorporated in the block diagram of FIG. 1.
Figure 4:
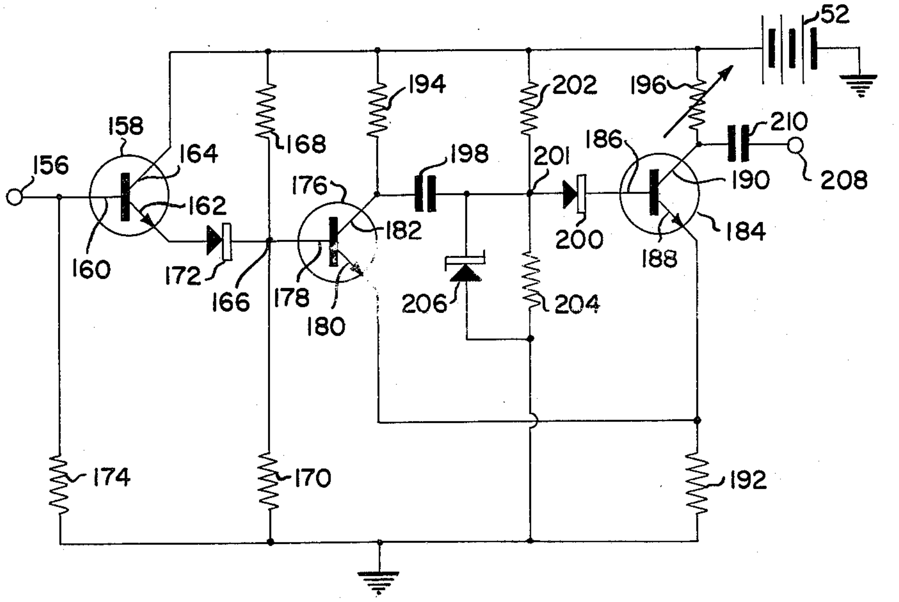
FIG. 4 is a circuit diagram of a preferred form of blanker control generator used in the block diagram of FIG. 1.

The amplified complex signal output, i.e., intermediate frequency signals and noise, is applied to the input terminal 100 of the interference detector 22 and amplifier 24, illustrated in FIG. 3. The detector 22 includes a diode 102 connected to the input terminal 100 through a capacitor 104. A second diode 106 is connected to the junction 108 of diode 102 and capacitor 104 through a resistor 110. Pre-biasing in a forward direction for each of the diodes 102 and 106 is provided by means of resistors 110, 112, and 114. The detected output from diode 102 is coupled to the interference amplifier 24 through a capacitor 116, and across a capacitor 118.

The amplifier 24 comprises two identical stages of amplification including transistors 120 and 122. The output from the detector 22 is applied to the base of transistor 120, and the amplified output at the collector of transistor 120 is coupled to the base of transistor 122 through a capacitor 124. Biasing for the bases of each transistor is provided by means of the resistors 126, 128, 130, and 132 while collector-emitter bias is provided by means of resistors 134, 136, 138, 140, 142, and 146, the capacitors 148 and 150 providing an alternating current by-pass. The output from the amplifier 24 is derived at output terminal 152 through a capacitor 154.

In the operation of the interference detector and amplifier in combination, it will be observed that the capacitors 104, 116, and 118 are charged and discharged at different rates by currents flowing through the diodes 102 and 106. This means that the back bias on both diodes, and particularly the diode 102, is continuously varied at a rate determined by the circuit time constants. This variable back bias on the diode 102 produces a modulation on the rectified radio frequencies which is applied across the base-emitter junction of transistor 120. It will be understood by persons skilled in the art that the application of two frequencies across a diode will produce diode amplification in a manner taught by Hunter in his Patent No. 2,666,816, and this feature produces a very steep wave front. Such a result occurs across the base-emitter diode junction of transistor 120. This is very desirable in the present application since very fast control is required in the noise channel in order to permit as small a delay as possible in the signal channel of the system.

The output signal from the pulse amplifier 24 is applied to the input terminal 156 of the blanker signal generator 26 which includes a stage of amplification and a unique one-shot multivibrator. The amplifier stage comprises a transistor 158 having a base 160, an emitter 162, and a collector 164. Collector 164 is connected directly to the battery 52 while the emitter 162 is connected to the junction 166 of resistors 168 and 170 through a diode 172. The base 160 is connected to ground through a resistor 174.

The one-shot multivibrator comprises a first transistor 176 having a base 178, an emitter 180, and a collector 182, and a second transistor 184 having a base 186, an emitter 188, and a collector 190. Emitters 180 and 188 are interconnected and connected to ground through a resistor 192, while the collector 182 is connected to the base 186 through a capacitor 198 and a diode 200. The collectors 182 and 190 are connected to the battery 52 through resistors 194 and 196, respectively. Bias for the base 178 is provided by the connection to the junction 166 of resistors 168 and 170, while bias for the base 188 is provided by the connection to the junction 201 of resistors 202 and 204 through the diode 200. A Zener diode 206 is connected across resistor 204 for a purpose to be described. The output from the transistor 184 is derived at terminal 208 through a capacitor 210 connected to the collector 190 of transistor 184.

In operation, output signals from the interference amplifier 24 are amplified by the transistor 158 and applied through the diode 172 to the base of transistor 176 to initiate one-shot multivibrator action. In the absence of noise there is no output signal from the amplifier 24, and under these circumstances the circuitry is arranged so that transistor 184 is normally conducting and the transistor 176 is cut off. The bias at the base 178 of transistor 176 is determined by the voltage division produced at the junction 166 of resistors 168 and 170, the diode 172 serving to protect the base-emitter diode junction of transistor 158 in the absence of signal. A relatively much higher bias is provided at the junction 201 by means of the resistors 202 and 204 in combination with the Zener diode 206 which clamps the voltage to a maximum value.

This biasing arrangement results in high conductivity of the transistor 184 and a heavy current flow through the resistor 192 to elevate the emitter 180 of transistor 176 so that the transistor 176 is cut off. Amplified positive noise pulses applied from the emitter 162 of transistor 158 through the diode 172 to the base 178 of transistor 176 cause conduction of transistor 176, thereby reducing the voltage appearing at the collector 182, and applying a negative pulse to the base 186, sufficient to cut off transistor 184. With a short duration pulse applied to the base 178, this state will continue until the capacitor 198 is recharged, and the transistors will then return to their original states of conductivity. Under these circumstances, output blanking pulses having a normal duration determined by the circuit time constants will be produced at the collector 190 of transistor 184.

Figure 5:
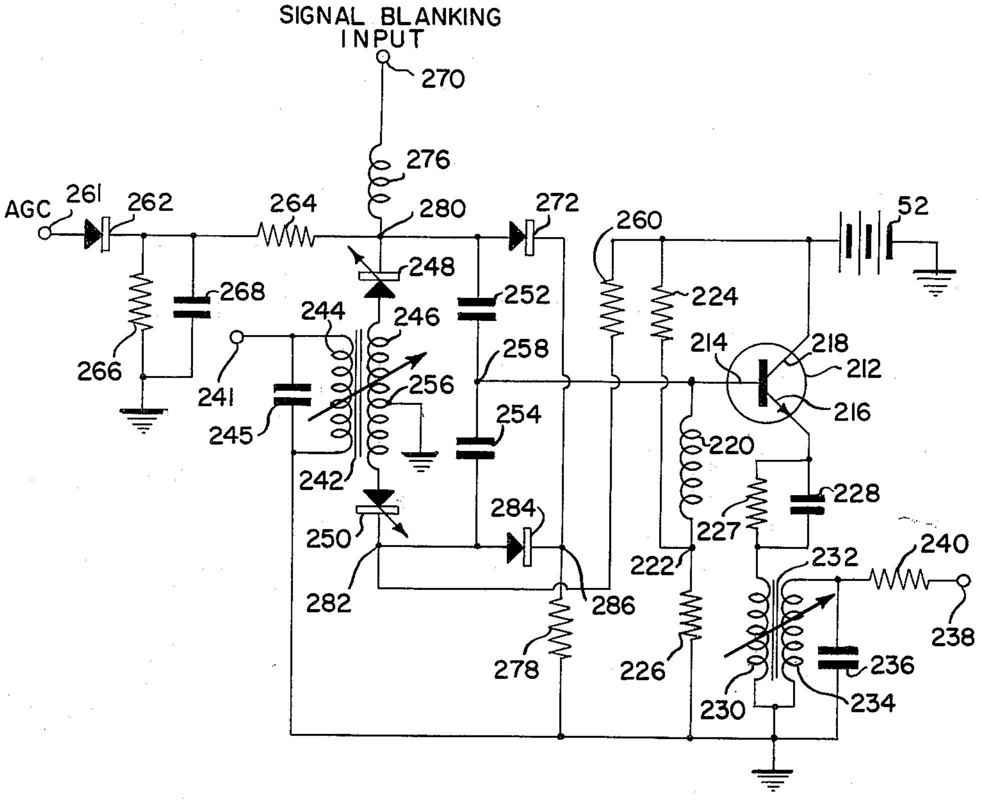
FIG. 5 is a circuit diagram showing a preferred intermediate frequency amplifier for use in the system of FIG. 1.

On the other hand, if large magnitude pulses exceeding the normal duration of the output blanking pulses are applied to the base of transistor 178, then the duration of the blanking pulse will be increased to a maximum period limited only by the decay time of coupling capacitor 210. This result is achieved since the base 186 is clamped to a maximum bias by the Zener diode 206, and hence the voltage on resistor 192 can maintain transistor 184 cut off for the duration of the noise pulse. This arrangement is advantageous since it is capable of producing a blanking pulse, the duration of which can be automatically varied by the duration of the noise when the magnitude and duration are excessive. The blanking pulse serves to cut off the intermediate frequency amplifier 14 shown in FIG. 5.

The intermediate frequency amplifier 14 includes a transistor 212 having a base 214, emitter 216, and collector 218. Direct current bias for the base electrode 214 is provided by a connection through an inductor 220 to the junction 222 of resistors 224 and 226 connected across the battery 52. The collector 218 is connected directly to the battery 52 while the emitter 216 is connected to ground through a parallel-connected resistor 227 and capacitor 228 in series with the primary winding 230 of a tunable emitter-follower transformer 232. The secondary winding 234 is tuned by a capacitor 236, and intermediate frequency output signals are derived at the terminal 238 through a resistor 240.

The intermediate frequency signals are applied from the delay network 16 to the terminal 241 in the input circuit for the transistor 212 which includes a tunable intermediate frequency transformer 242 having a primary winding 244 tuned by a capacitor 245. The secondary winding 246 of transformer 242 constitutes the I.F. source for a varactor diode bridge comprising varactors 248 and 250 connected in a series loop with the secondary winding 246 and capacitors 252 and 254. The I.F. output from the varactor diode bridge is derived from between the grounded center tap 256 and the junction 258 between the capacitors 252 and 254, and is applied between the collector and base electrodes of transistor 212 by means of a direct connection of junction 258 to the base 214 of transistor 212, and a capacitive connection from ground to the collector 218 through the battery 52.

Initially, the varactor diode bridge is unbalanced by the application of a back-biasing voltage to the varactor 250 by means of a connection to the battery 52 through a resistor 260, and therefore signals applied to the transformer 242 are also applied across the base-collector junction of transistor 212. In addition, the balance of the bridge is also controlled by the application of automatic gain control currents to the varactor diode 248 applied at terminal 261 through a diode 262 and a resistor 264, the resistor 266 and capacitor 268 providing a filter for unwanted alternating currents. Thus, application of AGC tends to balance the bridge to reduce signal output as signal strength increases.

For the purpose of blanking the output from the varactor diode bridge in the presence of noise, the output pulse from the blanker control generator 26 is coupled to the terminal 270 of the signal blanking input circuit of the intermediate frequency amplifier. The signal blanking input circuit includes a diode 272 connected to the input terminal 270 through an inductor 276, and to ground through a resistor 278. One side of diode 272 is connected to the junction 280 of varactor 248 and capacitor 252, while the other side of diode 272 is connected to the junction 282 of varactor 250 and capacitor 254 through an oppositely poled second diode 284.

In the operation of the intermediate frequency amplifier, a maximum strength I.F. signal is derived from between the junctions 258 and 256 of the varactor bridge in the absence of automatic gain control voltage and in the absence of a signal blanking input pulse. The application of gain control signals tends to back bias the varactor 248 and when the varactor 248 achieves the same degree of back bias as the varactor 250, a minimum signal output is derived from between the junctions 256 and 258, and the circuit parameters are chosen so that the AGC voltages never exceed the back bias on varactor 250.

The object of the blanking circuit is to balance the varactor bridge in the presence of noise to reduce signal input to the transistor 212 to an insignificant level. For this purpose the signal blanking pulse is provided with a magnitude sufficient to back bias the diode 262 thereby cutting off AGC control, and at the same time to back bias the diodes 272 and 284 to the same degree and thus balance the varactor diode bridge.

The application of a blanking pulse to the junction 280 serves to render the diode 272 conductive, thereby clamping the junction 280 and the junction 286 of diodes 272 and 284 at the same potential less the drop across the diode 272. Since the junction 286 is at the same potential as the junction 282 less the drop across the diode 284, the voltage at the junction 282 and 280 will be approximately equal. Hence upon the application of a signal blanking pulse of a magnitude sufficient to block the AGC, both the varactors 248 and 250 are back biased to the same extent, and the varactor bridge is balanced. So long as the magnitude of the signal blanking pulses is greater than the maximum AGC voltage, it is not critical since the junctions 280 and 282 are biased to the same voltage levels for pulses of any magnitude.

Thus there has been described a noise suppression system in which the intermediate frequency stage of a receiver is biased off in response to blanking pulses initiated in response to received noise impulses. The system includes the unique feature of delaying signal for a short period to permit fast processing of the noise impulses to develop a blanking pulse for cutting off the intermediate frequency amplifier at the time when noise would appear. In addition, the system includes a unique noise channel which includes wave-shaping means for obtaining a very fast-acting circuitry. The noise channel also includes means for developing a blanking pulse of variable duration depending upon impulse noise, magnitude, and duration. The intermediate frequency amplifier includes unique automatic gain control circuitry in combination with the blanking means for cutting off the amplifier in the presence of noise.

While the specific circuit parameters form no part of this invention and may be varied in accordance with the particular application, the following parameters used in a system actually reduced to practice are listed for the purpose of assisting persons skilled in the art to reproduce the invention:

| | |
|---|---|
| Varactors: | |
| 40 | Type V–39 |
| 42 | Type V–39 |
| 248 | Type V–33 |
| 250 | Type V–33 |
| Capacitors: | |
| 44 | μf.. .001 |
| 46 | μf.. .001 |
| 50 | μf.. .001 |

Capacitors:—Continued

| | | |
|---|---|---|
| 60 | μf | .01 |
| 74 | μf | .01 |
| 87 | μμf | 91 |
| 94 | μμf | 20 |
| 104 | μf | .0033 |
| 116 | μf | .05 |
| 118 | μμf | 390 |
| 124 | μf | .05 |
| 148 | μf | .1 |
| 150 | μf | .1 |
| 154 | μμf | 220 |
| 198 | μμf | 1,000 |
| 210 | μf | .05 |
| 228 | μf | .01 |
| 236 | μμf | 150 |
| 245 | μμf | 150 |
| 252 | μf | .001 |
| 254 | μf | .001 |
| 268 | μf | .01 |
| 274 | μf | .05 |

Resistors:

| | | |
|---|---|---|
| 48 | ohms | 22K |
| 56 | do | 68K |
| 58 | do | 33K |
| 70 | do | 22 |
| 72 | do | 2.7K |
| 78 | do | 4.7K |
| 80 | do | 4.7K |
| 96 | do | 100 |
| 110 | do | 12K |
| 112 | do | 33K |
| 114 | do | 8.2K |
| 126 | do | 12K |
| 128 | do | 12K |
| 130 | do | 12K |
| 132 | do | 3.9K |
| 134 | do | 2.2K |
| 136 | do | 100 |
| 138 | do | 3.9K |
| 140 | do | 1.2K |
| 142 | do | 100 |
| 146 | do | 3.90 |
| 168 | do | 1.5K |
| 170 | do | 330 |
| 174 | do | 330K |
| 192 | do | 330 |
| 194 | do | 3.3K |
| 196 | do | 820 |
| 202 | do | 15K |
| 204 | do | 12K |
| 224 | do | 2.2K |
| 226 | do | 1K |
| 227 | do | 300 |
| 240 | do | 750 |
| 260 | do | 56K |
| 264 | do | 22K |
| 266 | do | 820K |
| 278 | do | 18K |

Transistors:

| | |
|---|---|
| 62 | Type 2N706 |
| 120 | Type 2N706 |
| 122 | Type 2N706 |
| 158 | Type 2N706 |
| 176 | Type 2N706 |
| 184 | Type 2N706 |
| 212 | Type 2N706 |

Diodes:

| | |
|---|---|
| 102 | Type 1N252 |
| 106 | Type 1N252 |
| 172 | Type 1N270 |
| 200 | Type 1N252 |
| 262 | Type 1N252 |
| 272 | Type 1N252 |
| 284 | Type 1N252 |

Zener diode:

| | |
|---|---|
| 206 | Type SV-122 (5 volts) |

Inductors:

| | | |
|---|---|---|
| 220 | μh | 100 |
| 276 | μh | 100 |

Battery:

| | |
|---|---|
| 52 | 16 volts regulated |

With the foregoing parameters, the time delay network served to delay the signal for a period of about one microsecond, and the blanking pulse was designed for normal noise impulses for a duration of 30 microseconds. In the system reduced to practice, these parameters were used for eliminating ignition noise. However, where it is desired to eliminate other types of noise, the amount of delay and the duration of the blanking pulse should be adjusted to obtain optimum results.

Many modifications and adaptations will become readily apparent to persons skilled in the art, and for that reason it is intended that this invention be limited only by the appended claims as interpreted in the light of the prior art.

What is claimed is:

1. In a receiver, the combination comprising:
a source of signals, said signals fortuitously containing impulse noise;
said receiver including first and second channels;
said first channel comprising a delay network for delaying said signals for a fixed period; an amplifier for said delayed signals; and blanking means responsive to a blanking signal for blanking said amplifier for a predetermined period; a reactance birdge having input and output terminals, said amplifier for said delayed signals comprising a variable impedance device having an input circuit connected across the output terminal of said reactance bridge, said reactance bridge including first and second reactance elements, the impedance of each of said reactance elements being variable with applied voltage, and means for applying signal to said bridge;
said second channel including a detector for separating said impulse noise from said signal; and means responsive to said impulse noise for generating said blanking signal, said blanking signal being applied to said blanking means for blanking said amplifier;
means for pre-biasing the first of said rectance elements to unbalance said bridge thereby developing a signal at said output terminals of said bridge, said blanking signal being applied to the second of said reactance elements for rebalancing said bridge when noise is detected in said second channel thereby blanking the signal to the input circuit of said variable impedance device, the fixed period of said delay network being substantially equal to the time required for detecting said impulse noise, and said predetermined period of time being at least as long as the expected duration of said impulse noise.

2. The invention as defined in claim 1 and a source of automatic gain control applied to said second element.

3. The invention as defined in claim 1 and means for clamping the bias of said first and second elements at the same voltage level to maintain said bridge in balanced condition when said blanking signal exceeds the bias on said first element.

4. The invention as defined in claim 3 wherein said variable impedance device is a transistor having base, emitter, and collector electrodes, said input circuit being connected between said base and emitter electrodes.

5. In a signal amplifier, the combination comprising:
a variable impedance device having an input circuit;
a reactance bridge having output terminals connected across said input circuit, said reactance bridge including first and second reactance elements, the impedance of each of said reactance elements being variable with applied voltage;

means for applying signal to said bridge, the impedances of said bridge being normally balanced to provide no signal output at said output terminals in the absence of applied voltage to said reactance elements;
means for pre-biasing the first of said reactance elements to unbalance said bridge, thereby developing signal at said output terminals;
a source of blanking potential for eliminating said signal from said output terminals at various times, said source being connected to the second reactance element to rebalance said bridge at said various times.

6. The invention as defined in claim 5 and a source of automatic gain control voltage applied to the second reactance element.

7. The invention as defined in claim 5 and means for clamping said reactance elements at the same potential when said blanking potential exceeds said pre-biasing voltage.

8. In a signal amplifier, the combination comprising:
a current-flow device having an input electrode, an output electrode, and a common electrode;
an input circuit between said input and common electrodes;
a reactance bridge including first and second series connected oppositely poled reactor diodes;
first and second series connected fixed capacitors connected across said varactor diodes;
means connecting said input circuit between the junction of said varactor diodes and the junction of said capacitors;
means for applying signal to said bridge;
means for pre-biasing said first varactor diode to unbalance said bridge whereby said signal appears across said input circuit;
a source of automatic gain control voltage connected to said second varactor diode tending to rebalance said bridge in proportion to the magnitude of the gain control voltage.
means responsive to a predetermined condition for applying a blanking signal voltage to said other diode for rebalancing said bridge to eliminate said signal from said signal input;
and means for clamping said varactor diodes at the same potential when said signal blanking voltage exceeds said pre-biasing voltage.

9. A signal detector and amplifier comprising:
a signal source;
a transistor having base, emitter, and collector electrodes;
a first diode connected to said base electrode through a first capacitor;
a first resistor connected between said emitter electrode and a point of reference potential;
a second resistor and a second capacitor connected in parallel between the junction of said first diode and said first capacitor and said point of reference potential;
a second diode connected to said first diode through a third resistor;
a source of voltage connected to the junction of said third resistor and said second diode for pre-biasing each of said diodes;
means connecting said signal source across said third resistor and said second diode whereby said signal is detected by said first diode and said first and second capacitors are charaged and discharged by said detected signals at different rates, thereby causing variations in the pre-bias of said first diode to modulate said detected signals with said variations.

10. A one-shot multivibrator comprising:
a source of pulses;
a first and a second transistor, each having base, emitter, and collector electrodes;
a capacitive connection between the collector of said first transistor and the base of said second transistor;
means connecting each of said emitters to a point of reference potential through a common emitter-resistor;
a source of biasing potential;
means connecting said source between said point of reference potential and the collector electrodes of each of said transistors;
means connected across said source for biasing the base of each of said transistors, said second transistor being normally conductive and said first transistor being normally cut off;
a Zener diode connected between the base of said second transistor and said point of reference potential for clamping said base at a maximum level not exceeding the breakdown point of said Zener diode;
and means applying said source of pulses to the base of said first transistor.

11. In a receiver, the combination comprising:
a source of signals, said signals fortuitiously containing impulse noise;
said receiver including first and second channels;
said first channel comprising a delay network for delaying said signals for a fixed period; and amplifier for said delayed signals; and blanking means responsive to a blanking signal for blanking said amplifier for a predetermined period;
said second channel including a detector and impulse noise amplifier for separating and amplifying said impulse noise from said signal; and means responsive to said impulse noise for generating said blanking signal, said blanking signal being applied to said blanking means for blanking said amplifier, the fixed period of said delay network being substantially equal to the time required for detecting said impulse noise, and said predetermined period of time being at least as long as the expected duration of said impulse noise;
said detector and impulse noise amplifier comprising:
a transistor having base, emitter, and collector electrodes;
a first diode connected to said base electrode through a first capacitor;
a first resistor connected between said emitter electrode and a point of reference potential;
a second resistor and a second capacitor connected in parallel between the junction of said first diode and said first capacitor and said point of reference potential;
a second diode connected to said first diode through a third resistor;
a source of voltage connected to the junction of said third resistor and said second diode for pre-biasing each of said diodes; and
means connecting said source of signals across said third resistor and said second diode whereby said signal is detected by said first diode, and said first and second capacitors are charged and discharged by said detected signals at different rates, thereby causing variations in the pre-bias of said first diode to modulate said detected signals with said variations.

12. In a receiver, the combination comprising:
a source of signals, said signals fortuitously containing impulse noise;
said receiver including first and second channels;
said first channel comprising a delay network for delaying said signals for a fixed period; an amplifier for said delay signals; and blanking means responsive to a blanking signal for blanking said amplifier for a predetermined period;
said second channel including a detector for separating said impulse noise from said signal; and means responsive to said impulse noise for generating said blanking signal, said blanking signal being applied to said blanking means for blanking said amplifier, the fixed period of said delay network being substantially equal to the time required for detecting said impulse noise, and said predetermined period of time being at least as long as the expected duration of said impulse noise;

said means responsive to said detected impulse noise for generating said blanking signal is a one-shot multivibrator comprising:

a first and a second transistor, each having base, emitter, and collector electrodes;

a capacitive connection between the collector of said first transistor and the base of said second transistor;

means connecting each of said emitters to a point of reference potential through a common emitter-resistor;

a source of biasing potential;

means connecting said source between said point of reference potential and the collector electrodes of each of said transistors;

means connected across said source for biasing the base of each of said transistors, said second transistor being normally conductive and said first transistor being normally cut off;

a Zener diode connected between the base of said second transistor and said point of reference potential for clamping said base at a maximum level not exceeding the breakdown point of said Zener diode;

and means applying said impulse noise to the base of said first transistor.

References Cited by the Examiner

UNITED STATES PATENTS

| | | | |
|---|---|---|---|
| 2,623,174 | 12/52 | Hepp | 329—203 |
| 2,873,359 | 2/59 | Cooper et al. | 329—101 |
| 2,888,636 | 5/59 | McManis | 323—75 |
| 2,901,601 | 8/59 | Richardson et al. | 325—474 |
| 2,931,970 | 4/60 | Hilker | 325—75 |
| 2,939,018 | 5/60 | Faulkner | 307—88.5 |
| 3,014,127 | 12/61 | Vlasak | 325—478 |
| 3,018,387 | 1/62 | Beck | 307—88.5 |
| 3,048,789 | 8/62 | Herzog | 329—107 |

DAVID G. REDINBAUGH, *Primary Examiner.*